US006661732B2

(12) United States Patent
Sunaga

(10) Patent No.: US 6,661,732 B2
(45) Date of Patent: Dec. 9, 2003

(54) MEMORY SYSTEM HAVING REDUCED POWDER DATA REFRESH

(75) Inventor: Toshio Sunaga, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,070

(22) Filed: Mar. 15, 2002

(65) Prior Publication Data
US 2002/0167856 A1 Nov. 14, 2002

(30) Foreign Application Priority Data
Mar. 30, 2001 (JP) ........................................ 2001-097915

(51) Int. Cl.[7] ................................................. G11C 8/00
(52) U.S. Cl. .............................. 365/230.03; 365/185.11; 365/185.13; 365/149; 365/154
(58) Field of Search ....................... 365/230.03, 185.11, 365/185.13

(56) References Cited

U.S. PATENT DOCUMENTS

| 5,680,363 A | * | 10/1997 | Dosaka et al. | .......... 365/230.03 |
| 5,973,984 A | * | 10/1999 | Nagaoka | ................ 365/230.03 |
| 6,021,088 A | * | 2/2000 | Kim | ...................... 365/230.06 |
| 6,418,043 B1 | * | 7/2002 | Kang | ......................... 365/145 |

* cited by examiner

Primary Examiner—David Nelms
Assistant Examiner—Connie C. Yoha
(74) Attorney, Agent, or Firm—Anthony J. Canale

(57) ABSTRACT

The present invention discloses a memory whose power consumption for refresh is reduced to such a level as that of medium and low speed devices, such as SRAM, in its data retention mode. A predetermined number of word lines per block $12a$ is reduced by a factor n while the number of blocks $12a$ is increased by a factor n, thereby reducing the number of word lines crossing a bit line by the factor n. The bit line length is reduced and the bit line capacitance is reduced accordingly, so that power consumption of the memory array $16a$ is reduced.

7 Claims, 3 Drawing Sheets

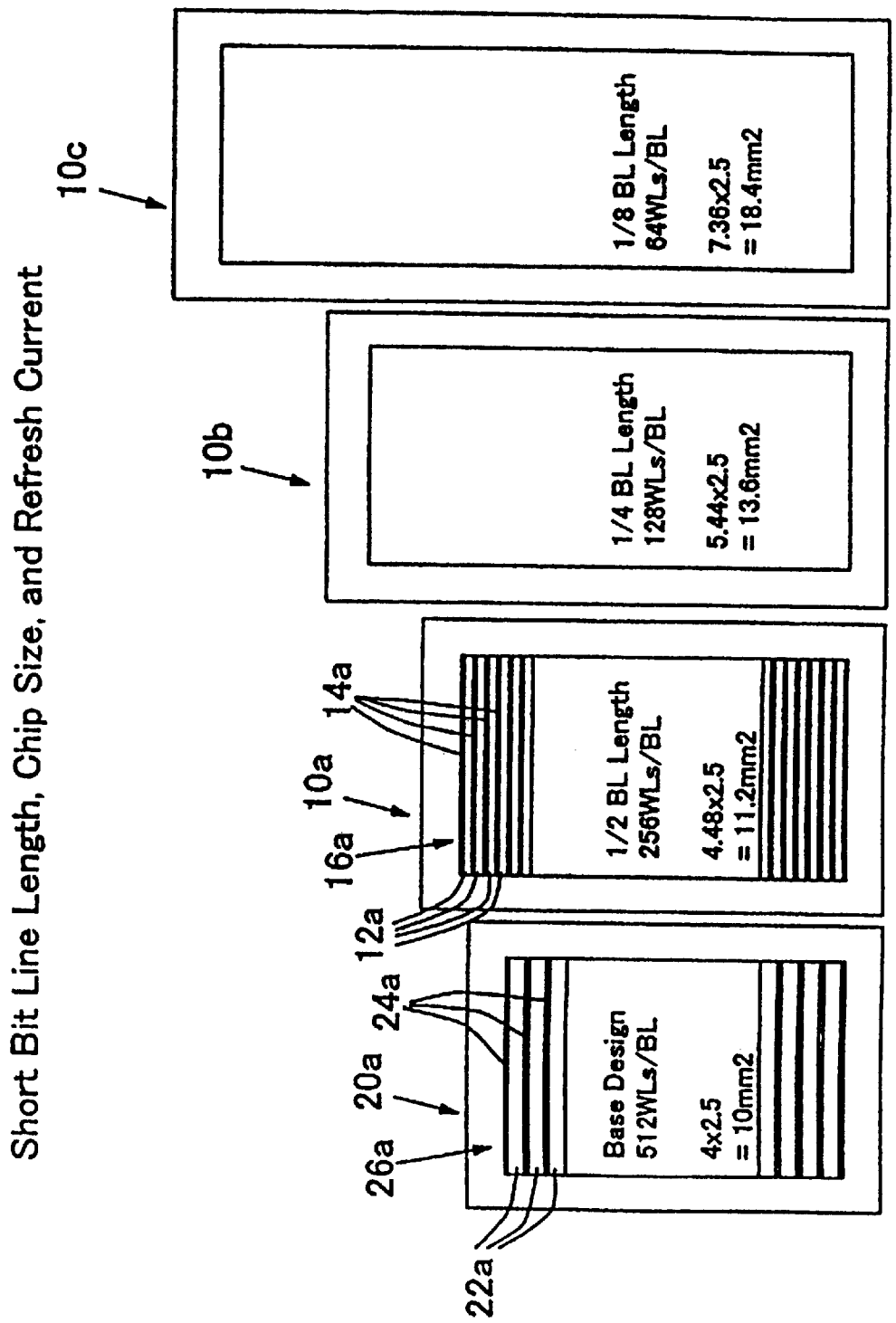

TABLE 1:

| Na | Nw | Active Current in 80-ns Cycle Time (mA) | | | Tret (ms) | Toref (μs) | Refresh Current (mA) | | |
|---|---|---|---|---|---|---|---|---|---|
| | | Peripheral | Array | Total | | | Peripheral | Array | Total |
| 256 | 64K | 10 | 0.5 | 10.5 | 64 | 1/1.024 | 819 | 37 | 856 |
| 512 | 32K | 10 | 1.0 | 11.0 | 64 | 2/1.024 | 410 | 37 | 447 |
| 1K | 16K | 12 | 2.0 | 14.0 | 64 | 4/1.024 | 246 | 37 | 283 |
| 2K | 8K | 12 | 4.0 | 16.0 | 64 | 8/1.024 | 123 | 37 | 160 |
| 4K | 4K | 14 | 8.0 | 22.0 | 64 | 16/1.024 | 72 | 37 | 109 |
| 8K | 2K | 14 | 16.0 | 30.0 | 64 | 32/1.024 | 36 | 37 | 73 |
| 8K | 2K | 14 | 16.0 | 30.0 | 128 | 64/1.024 | 18 | 19 | 37 |
| 8K | 2K | 14 | 16.0 | 30.0 | 256 | 128/1.024 | 9 | 9 | 18 |
| 8K | 2K | 14 | 16.0 | 30.0 | 512 | 256/1.024 | 5 | 5 | 10 |
| 16K | 1K | 16 | 32.0 | 48.0 | 512 | 512/1.024 | 3 | 5 | 8 |
| 32K | 512 | 18 | 64.0 | 82.0 | 512 | 1024/1.024 | 2 | 5 | 7 |

Row Access Active Current

Condition: 2.5V, 80-ns cycle time
Total Current: 10.5mA
 Peripheral: 10mA
 Array: 0.5mA (256 sense amplifiers)

Array Refresh Current $$I_{aref} = \frac{C_b \times V_{sw} \times N_m}{T_{ret}}$$
$$= 37 \, \mu A$$

Where, $N_m = 16$ Mb, $T_{ret} = 64$ msec
 $C_b = 0.14$ pF$(512W_{sl}/B)$l, $W_{sw} = 1.0$V

FIG. 2

TABLE 2:

| Number | 20a | 10b | 10b | 10a |
|---|---|---|---|---|
| BL Capacitance (fF) | 140 | 82 | 54 | 40 |
| Iaref (μA) @ 64ms 1-V BL Swing | 37 | 21 | 14 | 11 |
| Read Signal Ratio | 1.0 | 1.52 | 2.02 | 2.43 |
| Bit Line Swing (V) | 1.0 | 0.66 | 0.50 | 0.4 |
| Iaref (μA) @ 64ms Small BL Swing (V) | na | 14 | 7 | 5 |
| Peripheral Current (μA) | 36 @ Na=8K | 18 @ Na=16K | 9 @ Na=32K | 5 @ Na=64K |
| Total Refresh Current (μA) | 73 | 32 | 16 | 10 |

FIG. 3

MEMORY SYSTEM HAVING REDUCED POWDER DATA REFRESH

BACKGROUND OF THE INVENTION

1. Field of the Invention

The present invention relates to a memory, such as DRAM (dynamic RAM), whose power consumption for refresh is reduced to such a level as that of medium and low speed devices, such as SRAM (static RAM), in its data retention mode.

2. Background of the Invention

Certain memory devices, such as SRAM's, are able to hold data with low power so that it has various uses for low power applications such as when batteries are used as a power supply. However, SRAM's for low power applications have a large cell area because they are comprised of six transistors per cell, therefore, they are not suitable for memory with a large capacity. In particular, comparing a DRAM cell according to the recent technology, an area of an SRAM cell is eight to twelve times greater than that of DRAM when using the same design rule. Utilizing superiority of the area efficiency of DRAM, there is a trend toward replacing low-power SRAM with DRAM in the situation where the capacity is too large for SRAM but too small for DRAM.

BRIEF DESCRIPTION OF INVENTION

A problem when replacing an SRAM with DRAM is that refresh is unnecessary for SRAM but necessary for DRAM. In particular, in order to hold data even when the memory chip is in the standby state, a typical DRAM consumes several milliamperes of current, which is about 100 times that of SRAM. Therefore, it is difficult to replace an SRAM with DRAM as it is. A method for reducing this current consumption for holding data may include increasing a retention time for DRAM cells by improving the process technology or selecting chips that have a long retention time by screening.

However, in order to reduce current consumption of DRAM for holding data to about one hundredth being similar to that of SRAM, the retention time must be increased one hundred times, which is practically impossible. Therefore, replacing an SRAM capable of holding data with a low power DRAM has not been implemented to date. The reason for this will be described in detail below.

First, refresh current components will be analyzed. Though refresh is the same as normal row accesses, it needs no column address. As such, the operation is completed within a cycle of about 100 ns identical to normal accesses, during which current consumption is smaller than the normal row accesses because no column access exists, but still several tens of milliamperes are consumed. Since refresh normally occurs once for 16 µs, an average refresh current is a small value of several milliamperes, which is equal to the product of row access current and a ratio of row access cycle time to a refresh period.

Row access current, which consists of array and peripheral components, will be analyzed further. First, in the memory array, current flows because a number of bit line pairs are driven by sense amplifiers, wherein for each bit line pair, one bit line rises from the precharged voltage to an array power supply voltage, which is equal to half of the array power supply voltage, while the other falls from the precharged voltage to the ground. The refresh current, Ia ref, for the memory array caused by this operation is given by the following equation.

Equation 1: (1)

$$Iaref = \frac{Na \times Cb \times Vsw}{Tcref}$$

where, Na is the number of sense amplifiers activated by one row access, Cb is capacitance of one bit line, Vsw is a voltage swing of the bit line driven by the sense amplifier, and Tcref is a refresh period.

Furthermore, assuming that Nm is the total number of memory cells in the chip, Nw is the number of word lines to be refreshed repetitively, and Tret is a retention time of the cell, Nm and Tret are given as follows, respectively.

Equation 2:

$$Nm = Na \times Nw \qquad (2)$$

Equation 3:

$$Tret = Tcref \times Nw \qquad (3)$$

Thus, substituting Equations 2 and 3 for Equation 1, the following is obtained.

Equation 4: (4)

$$Iaref = \frac{Cb \times Vsw \times Nm}{Tret}$$

Equation 4 shows that for a memory having a predetermined number of bits, the current for the array portion is constant if the retention time of the cell is given. Namely, the refresh current remains the same regardless of refresh modes; a longer refresh period with many cells refreshed at a time or a shorter period with smaller cells. Moreover, Equation 4 shows that the refresh current decreases as the retention time is increased, however, it is impossible to increase the retention time such as 100 times or so.

On the other hand, the retention current for the peripheral circuits would be the product of the ratio of row access cycle time to a refresh cycle time and the operation current at row accesses, when it is assumed that the retention current consists of AC current only. Therefore, as the refresh period increases, this current decreases. As a whole, it is summarized that the refresh current for the array portion is constant while the refresh current for the peripheral circuits decreases if the number of cells to be refreshed at a time increases. Thus, the total refresh current decreases when refresh period becomes longer.

Table 1 shows calculated refresh currents for the above discussion for a 16 Mb DRAM assuming a 0.18 µm DRAM technology.

Table 1 assumes that operation current is 10.5 mA when row accesses are performed in 80 ns cycle time, wherein 0.5 mA is consumed in the array portion and 10 mA is consumed in the peripheral circuits when a small number, 256, of sense amplifiers are activated (i.e., page length is 256 bits). The refresh current for the array portion is given by the above Equation 4. For a 16 Mb memory with 64 ms retention time, the refresh current is 37 µA according to Equation 4 assuming that the bit line capacitance is 0.14 pF when 512 word lines exist per bit line and the bit line voltage swing is 1 V.

By increasing Na, the number of sense amplifiers to be activated at a time, from 256 to 32K, Nw, the number of word lines to be activated, which is necessary to complete refresh for a 16 Mb entire chip, decreases, and the refresh period Tcref increases, as shown in Table 1. For the same retention time such as 64 ms, as the number of sense amplifiers increases, the refresh current for the array portion remains the same 37 ÂμA. However, the refresh current for the peripheral circuits decreases, consequently the total retention current decreases from 856 ÂμA for 256 sense amplifiers to 73 ÂμA for 8K sense amplifiers.

However, since the retention current decreases down only to one tenth, the retention time must be increased to decrease the retention current much more, as shown in Table 1. However, it is practically impossible to increase the retention time as described above.

Therefore, for a given capacity of memory (i.e., Nm is fixed) even with the conventional 64 ms retention time, a new method for more than ten-times reduction in refresh current is required. Equation 4 shows that the refresh current can be reduced by decreasing the bit line capacitance and bit line voltage swing when Nm and Tret are given.

In order to decrease the bit line capacitance, its length may be shortened from a typical structure having 512 word lines to the one that has 256, 128 or 64 word lines.

As the length of bit lines decreases, the capacitance of them also decreases, thus a read signal would advantageously grow. In order to utilize the large read signal, it is conceivable to increase the retention time. This allows moving a center of the distribution of retention time to a longer value, however, what actually determines the retention time is the foot of the distribution in the shorter range that is dependent on defects or the like, so that this range can not be improved even by increasing the read signal. As a result, the increase in retention time is impossible.

It is therefore an object of the present invention to provide a method for reducing DRAM refresh current in both components of the memory array and peripheral circuits.

Another object of the present invention is to reduce data retention current for refresh for DRAM to about one hundredth of the prior current in order to replace an SRAM with DRAM. Thus, it aims to reduce memory cost significantly by exploiting DRAM's advantage in density.

According to the present invention, there is provided a DRAM having multiple blocks composing an array, wherein in each block a predetermined number of word lines and a predetermined number of bit lines are arranged in a matrix form and a sense amplifier is provided, wherein the predetermined number of word lines per block is reduced by a factor n (n is whole number greater than 1) while the number of the blocks is increased to n times, thereby reducing the number of word lines crossing a bit line by a factor n.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawing, in which:

FIG. 1 is a schematic diagram showing structures of DRAMs.

FIG. 2 is a table showing calculated refresh currents.

FIG. 3 is a table showing the affect on total refresh current by various factors.

DETAILED DESCRIPTION OF THE INVENTION

As shown in FIG. 1, DRAM's 10a, 10b and 10c of the present invention are composed of multiple blocks 12a, in each of which multiple word lines and multiple bit lines are arranged in a matrix form just like conventional DRAM 20a. Furthermore, a sense amplifier 14a is provided in each block 12a.

A fundamental structure in a typical design is shown at the far left, where each block 22a has 512 (predetermined number) word lines running laterally and a sense amplifier 24a of 29.5 Âμm in width is arranged for every 512 word lines. The chip size of this fundamental structure is 10 mm² (=4×2.5). DRAM's 10a, 10b and 10c shown on the right side correspond to when the bit line length is reduced to ½, 1/4 and ⅛, respectively.

As shown in FIG. 1, for a typical DRAM 20a, sense amplifiers 24a of 29.5 Âμm in width are provided such that they are sandwiched in between blocks 22a. Thus, if there are 16 blocks 22a, the number of sense amplifiers 24a is 17. Therefore, for DRAM 10a of the present invention, there are provided 32 blocks 12a and 33 sense amplifiers 14a of 29.5 Âμm in width. According to the present invention, as the number of blocks is increased n times, the number of sense amplifiers are increased by the same increase of blocks. The chip size increased longitudinally in this manner as shown in FIG. 1.

When comparing DRAM's 10a, 10b and 10c of the present invention with conventional DRAM 20a, there is provided one n-th the number of word lines of the prior art per block 12a, therefore, assuming the number of word lines of DRAM 20a of the prior art is 512, the present DRAM's 10a, 10b and 10c have 256, 128 and 64 word lines, respectively. Since the total number of word lines of memory array 16a is unchanged, the number of blocks 12a of DRAM's 10a, 10b and 10c increases n times. Necessarily, the number of word lines crossing one bit line decreases to 256, 128 and 64, respectively. As the number of word lines crossing one bit line decreases, the length of the bit line decreases and the bit line capacitance also decreases.

Owing to the increase of the number of sense amplifiers 14a, the chip area of DRAM 10a, 10b and 10c increases as the number of blocks 12a increases. It is seen from FIG. 1 that the chip area of DRAM 10c is 18.4 mm2 when 64 word lines cross one bit line, however, this is still extremely small compared with a conventional SRAM with an area of about 100 mm².

Next, a read signal will be described for DRAM's 10a, 10b and 10c of the present invention. The array voltage is represented as Va and the cell capacitance is represented as Cc, therefore, the magnitude of read signals Vr is given by the following equation.

Equation 5: (5)

$$Vr = \frac{Cc \times Va}{2(Cc \times Cb)}$$

Equation 5 shows that to keep Vr the same, Va can be reduced when bit line capacitance Cb decreases. For DRAM, since bit lines are precharged at half of the array voltage, the voltage swing of bit lines is half of the array voltage when sense amplifier 14a is activated. Thus the voltage swing can be reduced as well. Namely, the array voltage can be reduced by an amount corresponding to a reduction of bit line capacitance while maintaining the magnitude of read signals just the same as when 512 word lines exist. Therefore, both bit line capacitance Cb and voltage swing Vsw can be reduced by reducing the length of bit lines, as a result refresh current for the array portion can be greatly reduced.

Refresh current for the array portion 16a has been described hereinabove. A method for reducing current for peripheral circuits will be described below. Reducing the length of bit lines brings about a great effect by activating as many sense amplifiers 14a as possible to secure a long refresh period. As described earlier, though current for the array portion 16a is unchanged if a refresh period is changed. This means that an average current within the refresh period is unchanged even if activating a number of sense amplifiers 14a at a time. However, peak current for refresh becomes great in this case. This peak current is also reduced as a result of lowering of Cb and Vsw by reducing the length of bit lines, whereby a number of sense amplifiers 14a are easily activated at a time.

Furthermore, lowering of the array voltage allows for valuable characteristics for battery operations, that is, data holding for DRAM at a low voltage.

The present invention is summarized as follows, that is, (1) the length of bit lines is reduced, (2) an array voltage is reduced without changing read signals, because of a decrease of bit line capacitance due to a decrease of the bit line length, (3) a refresh period is increased by activating a number of sense amplifiers at a time, (4) a retention time of cells is increased since leakage current decreases that is caused by defects around diffusion layers of cell nodes when the array voltage decreases.

On the other hand, as a result of reducing the bit line length, more sense amplifiers 14a are required and consequently the chip size increases. The effects brought out by this will be described.

16 Mb DRAM with 64 ms retention time which is designed by a 0.18 Âμm DRAM technology will be used to illustrate the present invention. Table 2 shows to what degree the chip size is affected and how much the refresh current is reduced by decreasing the bit line length and increasing refresh period and lowering the array voltage. Note that heading "Number" shown in Table 2 corresponds to the symbols of DRAM's shown in FIG. 1.

As shown in Table 2, a conventional DRAM 20a has bit line capacitance of 140 fF, wherein 8K sense amplifiers 24a are activated and one bit line crosses 512 word lines. Bit line capacitance consists of components; 25 fF, which is associated with a bit switch and sense amplifier, and remaining 115 fF, which results from one bit line crossing 512 word lines. Therefore, the bit line capacitance would not be reduced by half and become 82 fF (=115/2+25) even if reducing the number of word lines that the bit line crosses to 256 (see column "10b" in Table 2). Bit line capacitance is shown in the second row (BL capacitance) in Table 2 when the bit line length is further reduced.

The third row (Iaref @ 64 ms 1-V BL Swing) of Table 2 shows refresh current of the array according to Equation 4, when bit line voltage swing is 1V. The fourth row of Table 2 (Read Signal Ratio) shows the relative ratio of read signals calculated by Equation 5 assuming that the cell capacitance is 30 fF and the fundamental structure 20a is considered to be the reference. Though the bit line voltage swing is still 1V herein, there are shown in the fifth row (Bit Line Swing) the bit line voltage swing that is reduced according to the relative ratio. The sixth row (Iaref @ 64 ms Small BL Swing) shows refresh current calculated by Equation 4 at respective bit line capacitance and bit line voltage swings. The seventh row (Peripheral Current) shows the current consumption for the portion of peripheral circuits when doubling the number of sense amplifiers to be activated at a time in order and increasing the refresh period accordingly in conjunction with the step-by-step decrease of bit line length, wherein the number of sense amplifiers starts from 8K for the fundamental structure. It is seen that the refresh current for the peripheral portion gradually decreases toward the right side of the table. In this manner, since the peak current is determined by the bit line capacitance and voltage swing even if the number of sense amplifiers are increased, so that the peak current according to the present invention is always lower than that for the fundamental structure. Finally, the eighth row (Total Refresh Current) shows the total refresh current, which gradually decreases as the bit line length is reduced step-by-step according to the present invention, wherein 10 ÂμA which is on a par with SRAM is achieved without changing the retention time of 64 ms. Though Table 2 shows that the refresh current can be reduced in this manner without changing the retention time, the retention time itself may be advantageously increased two to three times longer due to a decrease of the array voltage. Therefore, the array voltage could possibly be further reduced. The chip size would most likely be increased, however, the size of an SRAM with the same 16 Mb capacity would be as large as about 100 mm$^2$. For example, when reducing the bit line length to one eighth, the chip size would be 18.4 mm$^2$, which is 84% greater than that of conventional DRAM 20a but is much smaller than SRAM, thus there is a significant cost merit. Since the difference in the size of an SRAM and DRAM is very large, for chips having such a capacity that is too large for an SRAM, the increase of the chip size will be thoroughly accommodated by a decrease of refresh current according to the present invention, whereby an SRAM can be replaced with an inexpensive DRAM.

Hereinabove there have been described embodiments of a DRAM according to the present invention. However, the present invention is not limited to these embodiments. The present invention will be improved, modified and changed by those skilled in the art without departing from the spirit and scope of the invention.

As mentioned above, according to a DRAM of the present invention, a bit line length is reduced by reducing the number of word lines that crosses a bit line, whereby the bit line capacitance is reduced. Assuming that read signals of data are maintained constant, it becomes possible to lower the array voltage because of a decrease of the bit line capacitance. As a result of lowering the array voltage, a DRAM of the present invention will be substituted for an SRAM. Furthermore, a refresh period for DRAM can be increased by activating a number of sense amplifiers at a time, whereby power consumption in the peripheral circuits is restrained. Besides, the chip area for a DRAM has become smaller than that for a conventional SRAM, which reduces costs compared with conventional SRAM's.

What is claimed is:

1. A dynamic random access memory comprising:
a plurality of blocks comprising an array, wherein in each block a predetermined number of word lines and a predetermined number of bit lines are arranged in a matrix form and a sense amplifier is provided, further wherein said predetermined number of word lines per block is reduced by a first factor when the number of said plurality of blocks is increased by said first factor, thereby reducing the number of word lines crossing a bit line by said first factor such that a memory refresh current for said DRAM is about equal to a memory refresh current for an SRAM for a memory retention time target.

2. The memory according to claim 1, wherein reducing the number of word lines crossing a bit line by said first factor allows reducing bit line capacitance, and further wherein a voltage supplied to said array is reduced in conjunction with the decrease of said bit line capacitance.

3. The memory according to claim 2, wherein a retention time for cells is increased in conjunction with the decrease of said array voltage.

4. The memory according to claim 1, wherein a plurality of sense amplifiers are activated at a time, wherein said plurality of sense amplifiers are provided for each of said multiple blocks respectively.

5. A method for reducing memory refresh current in a dynamic random access memory, the method comprising the steps of:

provided a plurality of blocks comprising an array, wherein in each block a predetermined number of word lines and a predetermined number of bit lines are arranged in a matrix form and a sense amplifier is provided; and reducing by a first factor said predetermined number of word lines per block when the number of said plurality of blocks is increased by said first factor, wherein the number of word lines crossing a bit line is reduced by said first factor such that said memory refresh current for said DRAM is about equal to a memory refresh current for an SRAM for a memory retention time target.

6. The method according to claim 5, wherein the step of reducing decreases bit line capacitance, and further wherein a voltage supplied to said array is reduced in conjunction with the decrease of said bit line capacitance.

7. The method according to claim 6, wherein reducing said voltage supply increases a retention time for memory cells.

* * * * *